United States Patent
Kouketsu et al.

(10) Patent No.: US 7,626,227 B2
(45) Date of Patent: Dec. 1, 2009

(54) SEMICONDUCTOR DEVICE WITH REDUCED TRANSISTOR BREAKDOWN VOLTAGE FOR PREVENTING SUBSTRATE JUNCTION CURRENTS

(75) Inventors: Hiroaki Kouketsu, Aizuwakamatsu (JP); Masahiko Higashi, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/414,082

(22) Filed: Apr. 27, 2006

(65) Prior Publication Data

US 2007/0045720 A1    Mar. 1, 2007

Related U.S. Application Data

(63) Continuation of application No. PCT/JP2005/008056, filed on Apr. 27, 2005.

(51) Int. Cl.
*H01L 21/336* (2006.01)

(52) U.S. Cl. .................. 257/324; 257/411; 257/406; 257/390; 257/E27.102

(58) Field of Classification Search .......... 257/324, 257/411, 406, 390, E27.102
See application file for complete search history.

(56) References Cited

U.S. PATENT DOCUMENTS

| | | | |
|---|---|---|---|
| 6,011,725 A | 1/2000 | Eitan | |
| 6,248,633 B1 * | 6/2001 | Ogura et al. | 438/267 |
| 6,417,081 B1 * | 7/2002 | Thurgate | 438/526 |
| 6,492,677 B2 | 12/2002 | Takahashi et al. | |
| 6,559,010 B1 * | 5/2003 | Kuo et al. | 438/258 |
| 6,754,105 B1 * | 6/2004 | Chang et al. | 365/185.18 |
| 6,849,895 B2 * | 2/2005 | Osabe et al. | 257/311 |
| 6,939,767 B2 * | 9/2005 | Hoefler et al. | 438/267 |
| 6,940,152 B2 * | 9/2005 | Arai | 257/649 |
| 6,949,788 B2 * | 9/2005 | Fujiwara et al. | 257/314 |
| 6,979,856 B2 * | 12/2005 | Nishizaka et al. | 257/314 |
| 6,987,048 B1 * | 1/2006 | Cheng et al. | 438/262 |
| 7,125,763 B1 * | 10/2006 | Sobek et al. | 438/201 |
| 7,151,293 B1 * | 12/2006 | Shiraiwa et al. | 257/314 |
| 7,224,018 B2 * | 5/2007 | Shimizu | 257/314 |
| 2002/0000606 A1 * | 1/2002 | Eitan | 257/316 |
| 2002/0060365 A1 | 5/2002 | Takahashi et al. | |
| 2004/0102004 A1 | 5/2004 | Arai | |

FOREIGN PATENT DOCUMENTS

| | | |
|---|---|---|
| EP | 1 207 552 | 5/2002 |
| JP | 2000 260890 | 9/2000 |
| JP | 2002 158298 | 5/2002 |
| JP | 2004 253571 | 9/2004 |
| WO | WO 03 071 606 | 8/2003 |

* cited by examiner

*Primary Examiner*—Eugene Lee

(57) ABSTRACT

A semiconductor device is provided which includes a gate electrode (30) provided on a semiconductor substrate (10), an oxide/nitride/oxide (ONO) film (18) that is formed between the gate electrode (30) and the semiconductor substrate (10) and has a charge storage region (14) under the gate electrode (30), and a bit line (28) that is buried in the semiconductor substrate (10) and includes a low concentration diffusion region (24), a high concentration diffusion region (22) that is formed in the center of the low concentration diffusion region (24) and has a higher impurity concentration than the low concentration region, a source region, and a drain region. The semiconductor device can improve the source-drain breakdown voltage of the transistor while suppressing fluctuation of electrical characteristics or junction current between the bit line (28) and the semiconductor substrate (10).

5 Claims, 10 Drawing Sheets

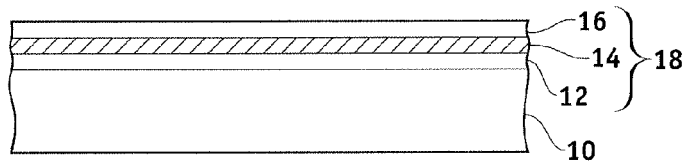
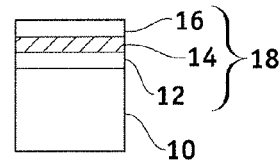
FIG. 1A
PRIOR ART
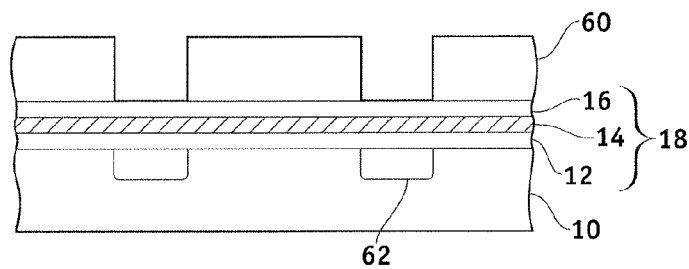
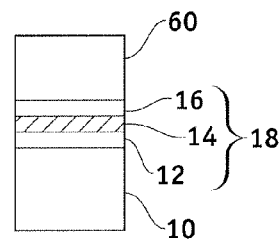
FIG. 1B
PRIOR ART
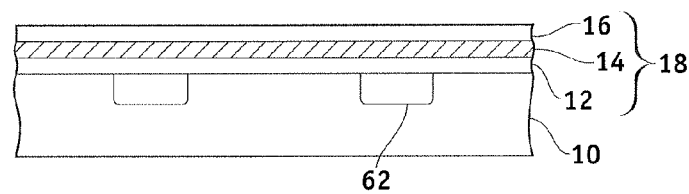
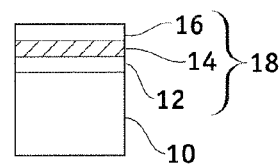
FIG. 1C
PRIOR ART
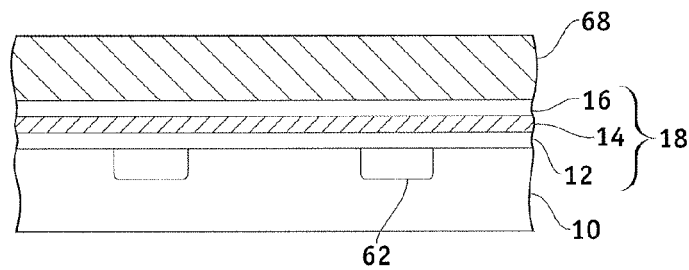
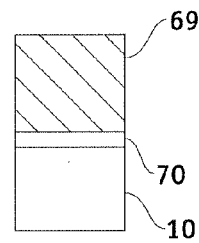
FIG. 1D
PRIOR ART

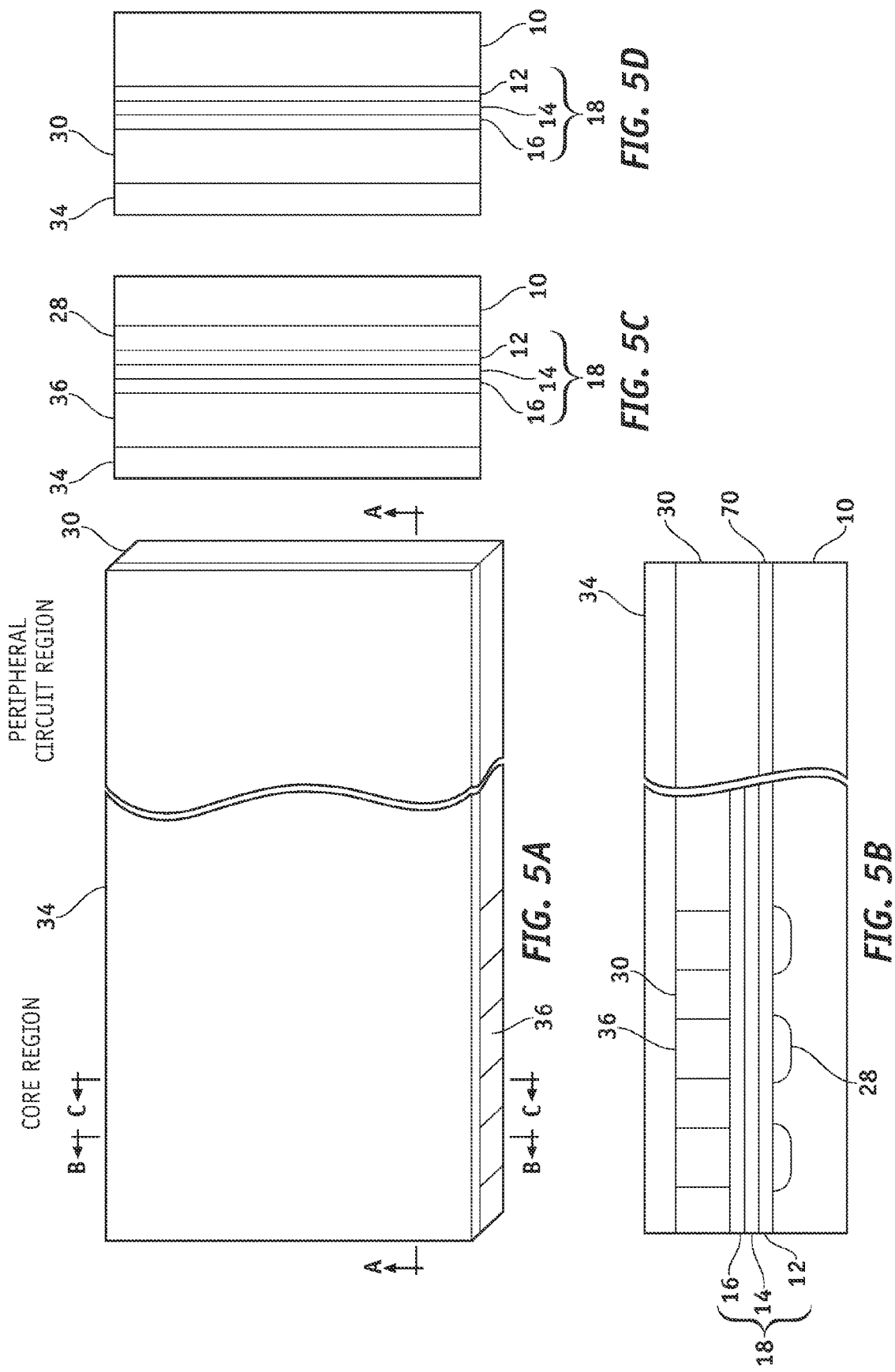

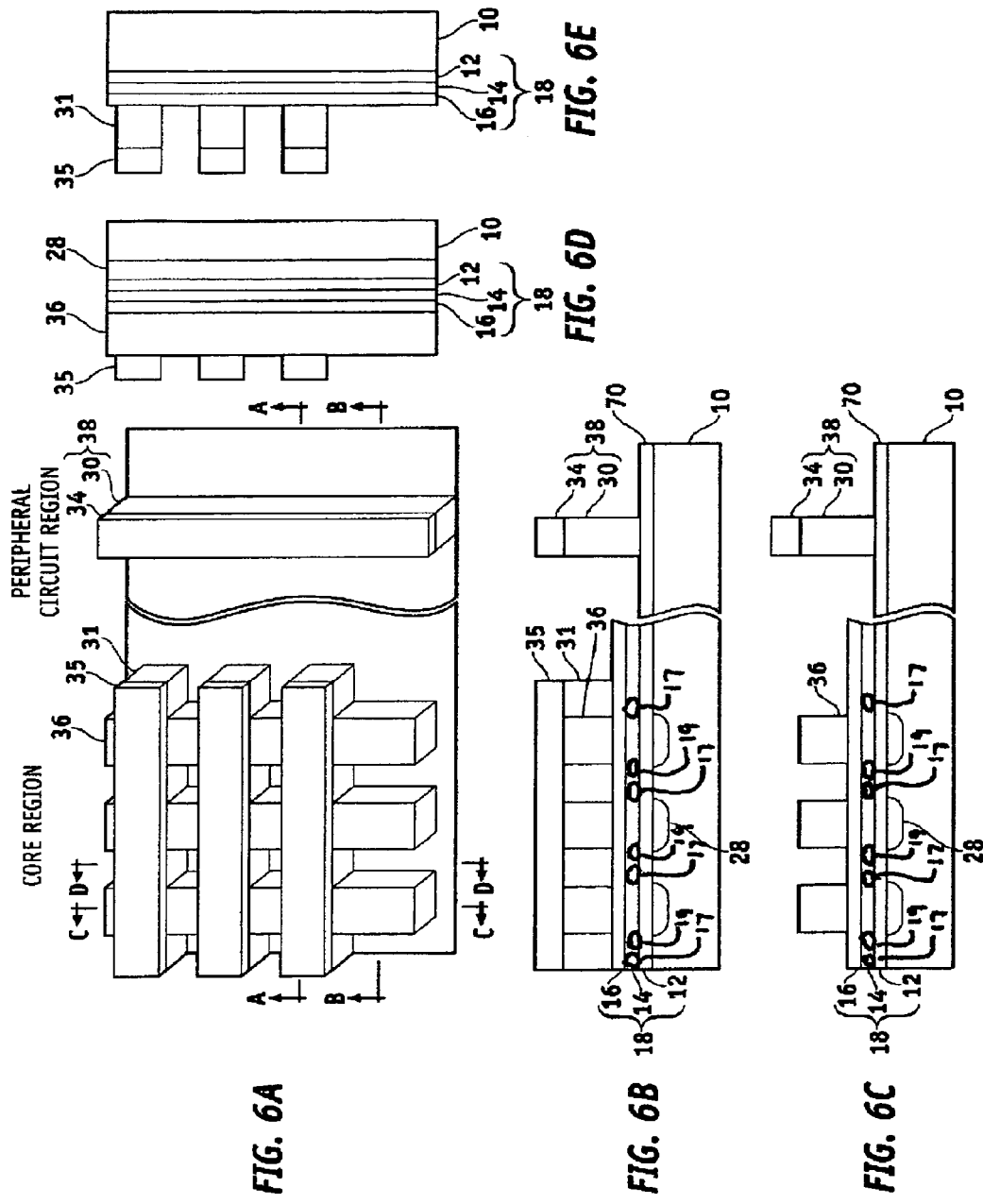

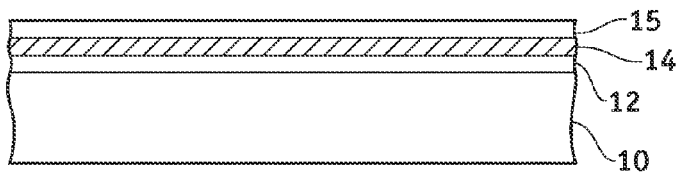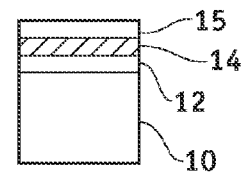
FIG. 7A
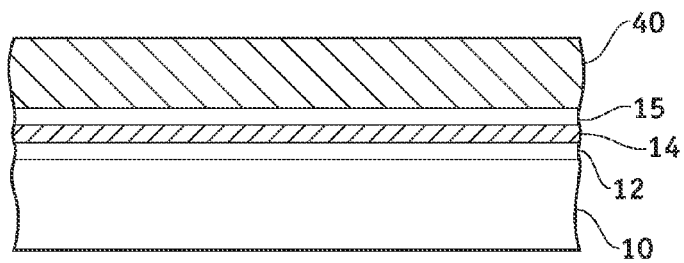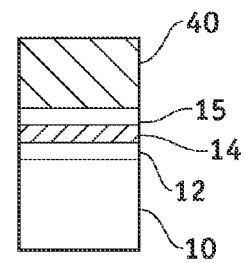
FIG. 7B
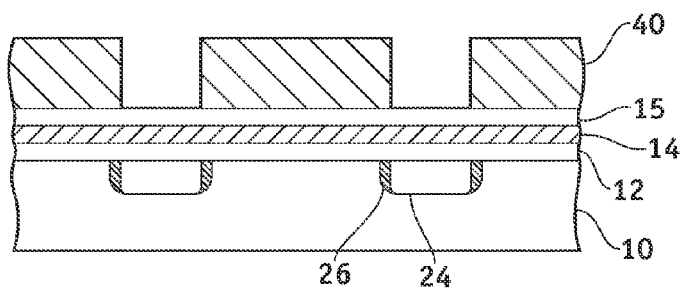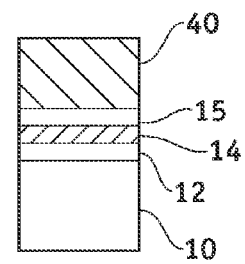
FIG. 7C
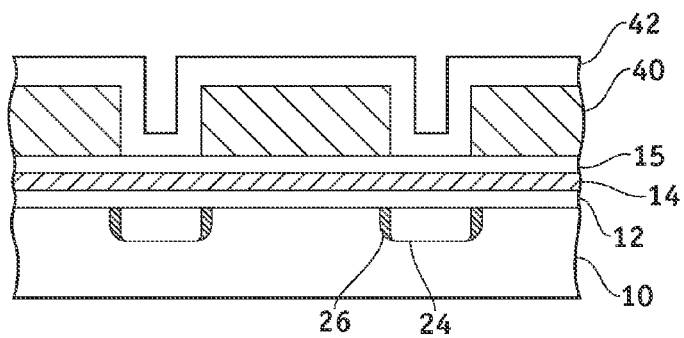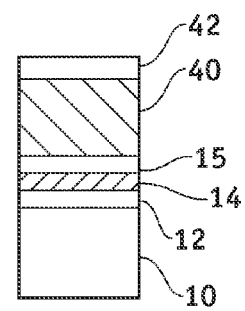
FIG. 7D

# SEMICONDUCTOR DEVICE WITH REDUCED TRANSISTOR BREAKDOWN VOLTAGE FOR PREVENTING SUBSTRATE JUNCTION CURRENTS

CROSS-REFERENCES TO RELATED APPLICATION

This is a continuation of International Application No. PCT/JP2005/008056 filed Apr. 27, 2005, which was not published in English under PCT Article 21(2).

BACKGROUND OF THE INVENTION

1. Field of the Invention

The present invention relates to semiconductor devices and manufacturing methods therefor. In particular, the present invention relates to a semiconductor device that is a non-volatile memory using a transistor having multiple charge storage regions and a manufacturing method therefor.

2. Description of the Related Art

In recent years, semiconductor devices that are non-volatile memories to which data can be overwritten are widely used. Technological developments are being made concerning such non-volatile memories with the purpose of miniaturizing memory cells for high storage capacity. For example, non-volatile memories such metal oxide nitride oxide silicon (MONOS)-type and silicon oxide nitride oxide silicon (SONOS)-type flash memories stored electric charge in an oxide/nitride/oxide (ONO) film. Furthermore, flash memory that has two or more charge storage regions in one transistor for the purpose of increasing storage capacity has been developed. For example, U.S. Pat. No. 6,011,725 discloses a transistor having two charge storage regions between a gate electrode and a semiconductor substrate. This transistor interchanges the source and drain and is symmetrically operated. In this way, a structure that does not differentiate between the source region and the drain region is provided. Furthermore, the bit lines serve as the source and drain regions and are buried in the semiconductor substrate. In this way, miniaturization of the memory cells is realized.

A manufacturing method as disclosed in U.S. Pat. No. 6,011,725 (Conventional Art 1) is explained with reference to FIGS. 1(a) through 1(d). The left side of the diagram is a core region and the right side is a peripheral circuit region of a memory device. The core region is a region in which the memory cells are arranged and the peripheral circuit region is a region including a decoder, an input and output circuit, and other peripheral circuits.

Referring to FIG. 1(a), a tunnel oxide film 12 (silicon oxide film), a trap layer 14 (silicon nitride film), and a top oxide film 16 (silicon oxide film) are formed on a semiconductor substrate 10 as an ONO film 18. In FIG. 1(b), arsenic, for example, is ion-implanted with a photoresist 60 serving as a mask to form a bit line 62 including a source region and a drain region. In FIG. 1(c), the photoresist 60 is removed. In FIG. 1(d), the ONO film 18 in the peripheral circuit region is removed and a gate oxide film 70 (silicon oxide film) is formed. A polycrystalline silicon film is formed and a predetermined area is removed, so that a word line 68 that serves as a gate electrode in the core region and a gate electrode 69 in the peripheral circuit region are formed. Subsequently, a transistor is formed in the peripheral circuit region and the flash memory is completed by the formation of an interlayer insulating film, the formation of an interconnection layer, and the formation of a protective film.

Conventional Art 1 functions as a non-volatile memory in which the semiconductor substrate 10 between bit lines 62 functions as a channel and the ONO film 18 between the channel and the word line 68 stores electrical charges. The charge storage region can be formed in two locations between the bit lines 62 under the word line 68. The bit line 62 is formed by a diffusion region, and thus, has a higher resistance than metal. As a result, programming and erasing characteristics become poor. To compensate therefor, the bit line 62 is connected to an interconnection layer by a contact hole formed on the interlayer insulating film for every multiple word lines 68 crossed. To miniaturize the memory cells, the bit line 62 is required to have a low resistance and the number of contact holes connecting with the interconnection layer must necessarily be reduced.

Japanese Patent Application No. 2004-253571 (Conventional Art 2) discloses a MONOS-type flash memory including a charge storage region composed of an ONO film between control gates provided on both sides of a memory gate connected to a word line and a semiconductor substrate, and a bit line that serves as a source region and a drain region and is buried in the semiconductor substrate. The bit line is composed of a high concentration diffusion region and low concentration diffusion regions provided on both sides of the high concentration diffusion region. A manufacturing method therefor forms the high concentration diffusion region by ion implantation with the control gate as a mask and, after etching the control gate, forms the low concentration diffusion regions by ion implantation.

In Conventional Art 1, to lower the resistance of a bit line 62 for the purpose of miniaturizing the memory cells, it is preferable to increase the energy and increase the dosage of the ion implantation that forms the bit line 62. However, the source region and the drain region are formed with high energy and high dosage, and the breakdown capability of the source and the drain decreases. In addition, impurities in the high concentration diffusion region are dispersed by a heat-treatment procedure after the formation of the bit line 62, causing the electrical characteristics of the transistor to fluctuate. Furthermore, when the contact hole connecting the bit line 62 to the interconnection layer detaches from the bit line due to misalignment, a junction current flows between the bit line 62 and the semiconductor layer.

In Conventional Art 2, the sizes of the high concentration diffusion region and the low concentration diffusion region are determined by the amount of side-etching on the control gate and, thus, the size accuracy is poor and fluctuation in the transistor characteristics increases. Furthermore, Conventional Art 2 cannot be implemented in a transistor having two charge storage regions between the gate electrode and the semiconductor substrate such as disclosed in Conventional Art 1.

SUMMARY OF THE INVENTION

The present invention has been made in consideration of the above circumstances and an object of the present invention is to provide a semiconductor device that can improve the source-drain breakdown voltage of a transistor and suppress fluctuation of electrical characteristics or suppress junction current between a bit line and a semiconductor substrate and a manufacturing method therefor.

According to an aspect of the present invention, there is provided a semiconductor device including: a gate electrode located above a semiconductor substrate; an oxide/nitride/oxide (ONO) film formed between the semiconductor substrate and the gate electrode and having a charge storage region under the gate electrode; and a bit line including a low concentration diffusion region, a high concentration diffusion region provided in the center of the low concentration diffusion region with a higher impurity concentration than the low concentration region, a source region, and a drain region, the bit line formed in the semiconductor substrate. In accordance with the present invention, the bit line has a low-doped drain (LDD) structure. As a result, the decrease in the source-drain breakdown voltage of the transistor can be prevented. In addition, fluctuation in the transistor characteristics can be prevented. Furthermore, the flow of junction current between the bit line and the semiconductor substrate can be prevented.

The semiconductor substrate may be configured so that the bit line includes pocket implantation diffusion regions formed at both sides of the low concentration diffusion region. In accordance with the present invention, a semiconductor device that can suppress a short channel effect of the transistor can be provided.

The semiconductor device may also be configured so that the ONO film has multiple charge storage regions. In addition, the present invention can be a semiconductor device including a word line provided across the bit line and connected to the gate electrode at an upper side thereof. In accordance with the present invention, the LDD structure of the bit line can be implemented even in a semiconductor having multiple charge storage regions for high storage capacity.

The semiconductor device may additionally be configured so as to include sidewalls provided at the sides of the gate electrode. In accordance with the present invention, the fluctuation in the transistor characteristics that occurs during the formation of the LDD structure of the bit line can be prevented.

The semiconductor device may include a silicided metal layer provided on the bit line and running in a length direction of the bit line continuously. In accordance with the present invention, the resistance of the bit line can be reduced and the memory cells can be miniaturized.

According to another aspect of the present invention, there is provided a manufacturing method of a semiconductor device including: a step of forming an ONO film on a semiconductor substrate; a step of forming a mask layer on the ONO film; a step of forming a low concentration diffusion region by using the mask layer as a mask for ion implantation, the concentration diffusion region being included within a bit line including a source region and a drain region; and by using the mask layer and the sidewalls as a mask for ion implantation, forming a high concentration diffusion region having a higher concentration than the low concentration diffusion regions and also included within the bit line. In accordance with the present invention, a semiconductor device in which the bit line has an LDD-structure can be manufactured. As a result, the decrease in the source-drain breakdown voltage of a transistor can be prevented. In addition, fluctuation in transistor characteristics can be prevented. Furthermore, the flow of junction current between the bit line and the semiconductor substrate can be prevented.

The manufacturing method may include forming pocket implantation diffusion regions at both sides of the low concentration diffusion region by using the mask layer as a mask for ion implantation. In accordance with the present invention, a manufacturing method of a semiconductor device that can suppress the short channel effect of the transistor can further be provided.

The manufacturing method may additionally include a mask layer including a metal or an insulator. In accordance with the present invention, the sidewalls can be formed on the side surfaces of the mask layer and the fluctuation in the transistor characteristics that occur during formation of the LDD structure of the bit line can be prevented.

The manufacturing method may also include a step of forming a metal layer on the mask layer and a step of forming a word line by etching the metal layer and the mask layer, the word line including the metal layer and a gate electrode including the mask layer. In accordance with the present invention, the manufacturing method can be simplified because the mask layer and the gate electrode are used.

The manufacturing method may further include a step of forming a silicided metal layer on the bit line by using the mask layer and the sidewalls as a mask. In accordance with the present invention, the resistance of the bit line can be reduced and the memory cells can be miniaturized.

The present invention is a manufacturing method of a semiconductor device that includes a step of selectively forming a resin layer on the silicided metal layer and removing the mask layer, in which the resin layer covers the trap layer in the ONO film during the step of removing the mask layer. In accordance with the present invention, removal of the trap layer when removing the mask layer can be prevented.

In accordance with the present invention, a semiconductor device that can improve the source-drain breakdown voltage of the transistor and suppress fluctuation in the electrical charges or control the joint current between the bit line and the semiconductor substrate and a manufacturing method therefor is provided.

BRIEF DESCRIPTION OF THE DRAWINGS

FIGS. 1(a) to 1(d) are respective cross-sectional views of a conventional flash memory and a manufacturing method therefor;

FIGS. 5(a) to 5(d) are, respectively, a second cross-sectional view and a second dimensional view of the flash memory and the manufacturing method therefor in accordance with the first embodiment of the present invention;

FIGS. 6(a) to 6(e) are respective third cross-sectional and dimensional views of the flash memory and the manufacturing method therefor in accordance with the first embodiment of the present invention;

FIGS. 7(a) to 7(d) are first cross-sectional views of a flash memory and a manufacturing method therefor in accordance with a second embodiment of the present invention;

DESCRIPTION OF THE PREFERRED EMBODIMENTS

Hereinafter, the embodiments in accordance with the present invention will be explained with reference to the attached drawings.

First Embodiment

A flash memory and a manufacturing method therefor in accordance with a first embodiment are explained with reference to FIGS. 2(a) to 2(d) to FIGS. 6(a) to 6(e). FIGS. 2(a) to 2(d) and FIGS. 3(a) to 3(d) are diagrams of a cross-sectional view in a bit line direction of a transistor forming a core. The left side is a core region of a memory cell and the right side is a peripheral circuit region. FIGS. 4(a) and 4(b) to FIGS. 6(a) to 6(e) are oblique top views and cross-sectional views.

Figure 2A:
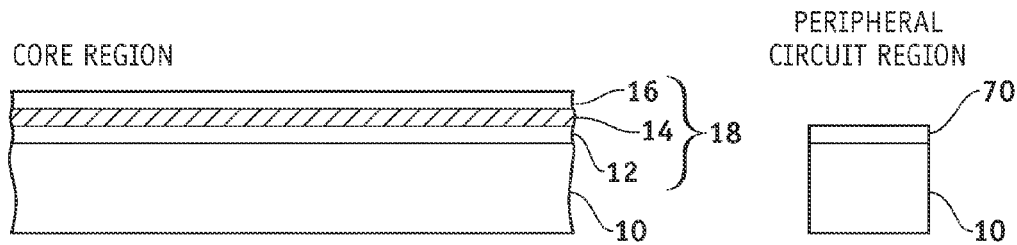
FIGS. 2(a) to 2(d) are respective first cross-sectional views of a flash memory and a manufacturing method therefor in accordance with a first embodiment of the present invention.

Referring to FIG. 2(a), a tunnel oxide film 12 (silicon oxide film), a trap layer 14 (silicon nitride film), and a top layer 16 (silicon oxide film) are formed on a P-type silicon semiconductor substrate 10 (or a P-type semiconductor region formed within the semiconductor substrate) as an oxide/nitride/oxide (ONO) film 18. The tunnel oxide film 12 is formed by, for example, a thermal oxidization method, and the trap layer 14 and the top oxide film 16 are formed by, for example, a chemical vapor deposition (CVD) method. The ONO film 18 in the peripheral circuit region is removed and a gate oxide film 70 (silicon oxide film) is formed by, for example, thermal oxidation.

Figure 2B:
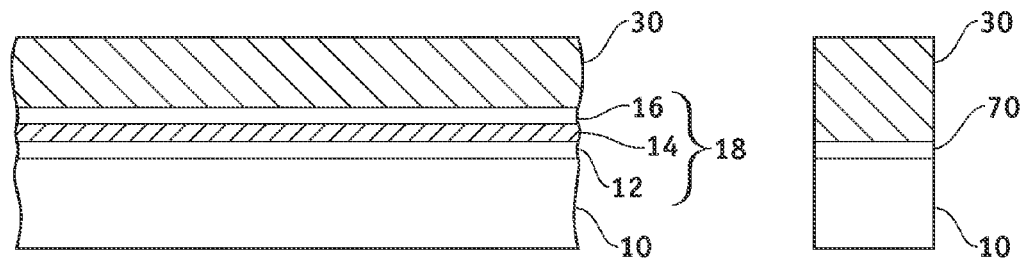
Figure 2C:
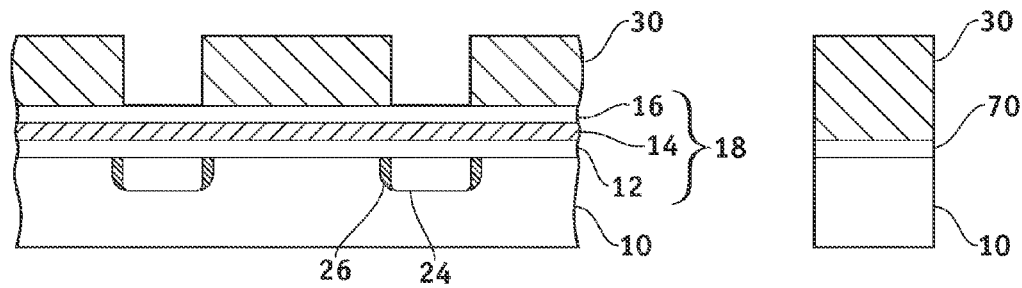
Figure 3A:
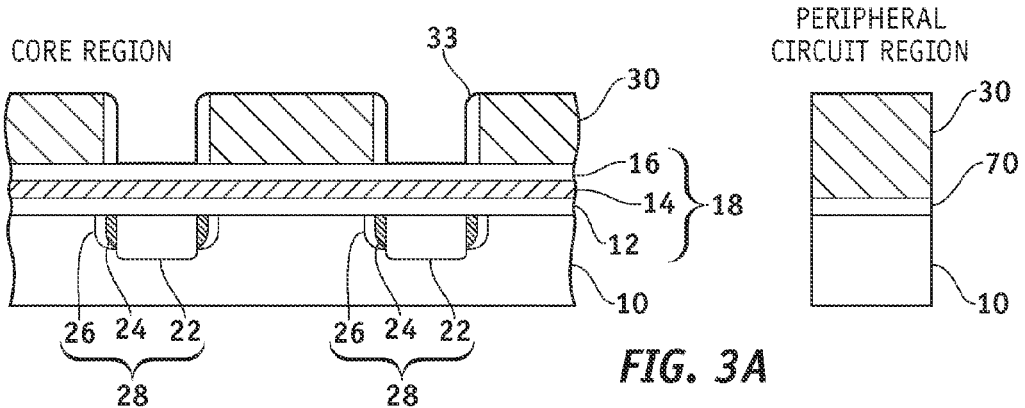
FIGS. 3(a) to 3(d) are respective second cross-sectional views of the flash memory and the manufacturing method therefor in accordance with the first embodiment of the present invention.
Figure 3B:
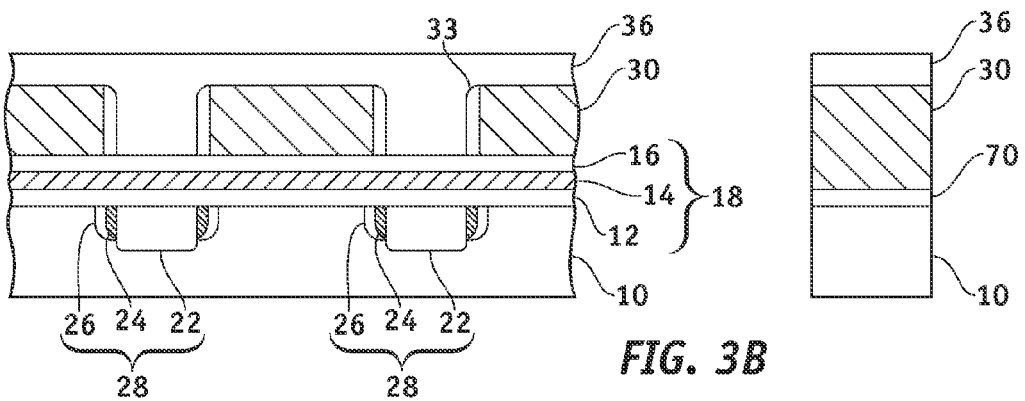
Figure 3C:
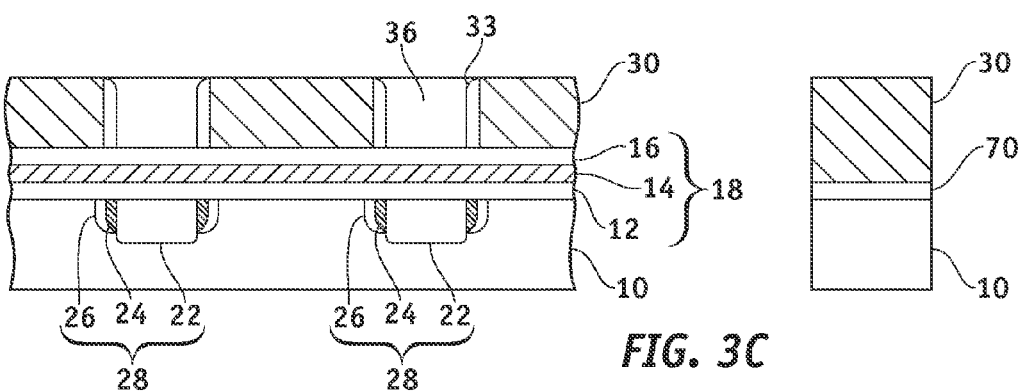
Figure 3D:
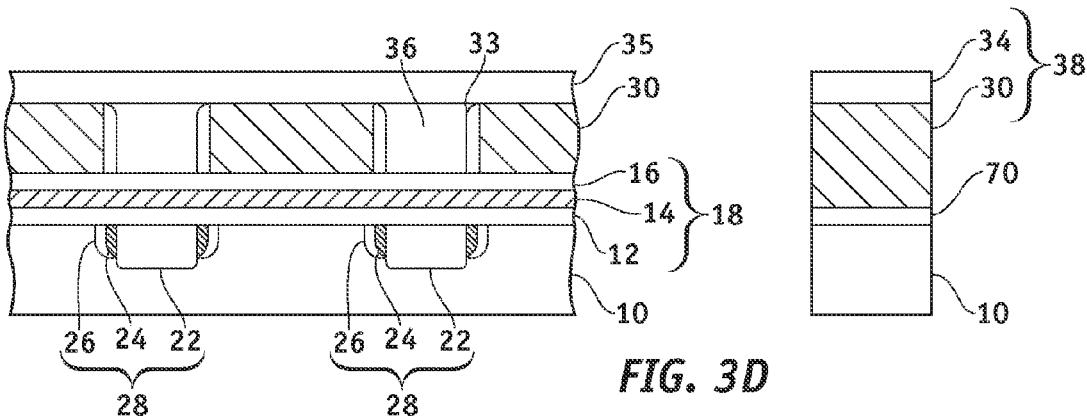

In FIG. 2(b), a first polycrystalline silicon film 30 that becomes gate electrodes 31 and 38 (FIG. 3(d)) and also functions as a mask layer is formed on the entire surface. In FIG. 2(c), the first polycrystalline silicon film 30 above a region serving as a source region and a drain region forming a bit line 28 is etched and an opening region is formed. Subsequently, a low concentration diffusion region 24 is formed by implanting arsenic in the semiconductor substrate 10 at, for example, an implantation energy of 30 keV and an implantation dosage of $5 \times 10^{14}$ cm$^{-2}$, using the non-etched portions of the first polycrystalline silicon-film 30 as a mask, and subsequently performing heat-treatment thereto. In other words, the low concentration diffusion region 24 composing the bit line 28 which is buried in the semiconductor substrate 10 and includes the source region and the drain region is formed-through ion implantation using the mask layer formed on the ONO film 18 as the mask. Furthermore, pocket implantation diffusion regions 26 are formed on both sides of the low concentration diffusion region 24 by performing pocket-implantation using boron, for example, at an implantation energy of 30 keV, an implantation dosage of $4 \times 10^{13}$ cm$^{-2}$, and an ion irradiation angle of 15° to the vertical line of the semiconductor substrate and subsequently performing heat-treatment thereto. In other words, the pocket implantation diffusion regions 26 are formed on both sides of the low concentration diffusion region 24 in the width direction by performing pocket-implantation using the mask layer as the mask. Short channel effect of the transistor can be prevented by the formation of the pocket implantation diffusion regions 26.

Figure 2D:
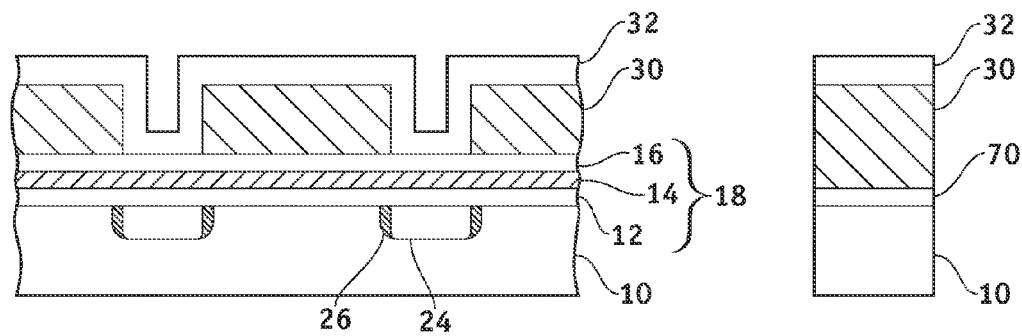

In FIG. 2(d), a sidewall film 32 having a film thickness of 50 nm is formed with, for example, silicon oxide film on the first polycrystalline silicon film 30. referring to FIG. 3(a), sidewalls 33 are formed on the side surfaces of the first polycrystalline film 30 in the bit line 28-width direction by etching. The film thickness of the sidewall film 32 can control the width of the sidewall 33. If the film thickness of the sidewall film 32 is 10 nm, the width of the sidewall 33 can be about 7 nm. The sidewall 33 can be an insulating film or a metal. A high concentration diffusion region 22 is formed by implanting arsenic, for example, at an implantation energy of 40 keV and an implantation dosage of $2 \times 10^{15}$ cm$^{-2}$, in the semiconductor substrate 10 using the first polycrystalline silicon film 30 and the sidewalls 33 as the mask, and subsequently performing heat treatment thereto. In other words, the high concentration diffusion region 22 that composes the bit line 28 and has a higher impurity concentration than the low concentration diffusion region 24 is formed by ion implantation using the mask layer and the sidewalls 33 formed on the side surfaces of the mask layer as the mask.

In FIG. 3(b), a silicon oxide film 36 is formed to bury the opening region and cover the polycrystalline silicon film 30. In FIG. 3(c), the silicon oxide film 36 is left remaining in the opening region of the first polycrystalline silicon film 30 by planarization through a chemical mechanical planarization (CMP) method. And in FIG. 3(d), the word line that serves as the gate electrode is formed in the core region by deposition of a polycrystalline silicon film 35 and etching of a predetermined region. The gate electrode 38 that includes the word line in the peripheral region, including a metal layer intersecting with the bit line 28, and the mask layer is formed by etching the second polycrystalline silicon film 34 (metal layer) and the first polycrystalline silicon layer 30 (mask layer).

Figure 4A:
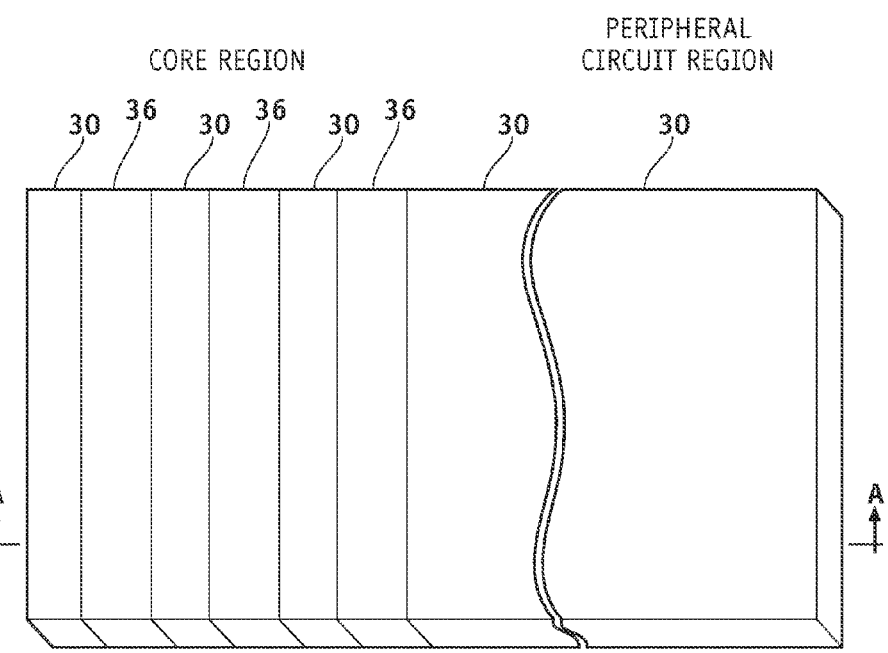
FIGS. 4(a) and 4(b) are, respectively, a first cross-sectional view and a first dimensional view of the flash memory and the manufacturing method therefor in accordance with the first embodiment of the present invention.
Figure 4B:
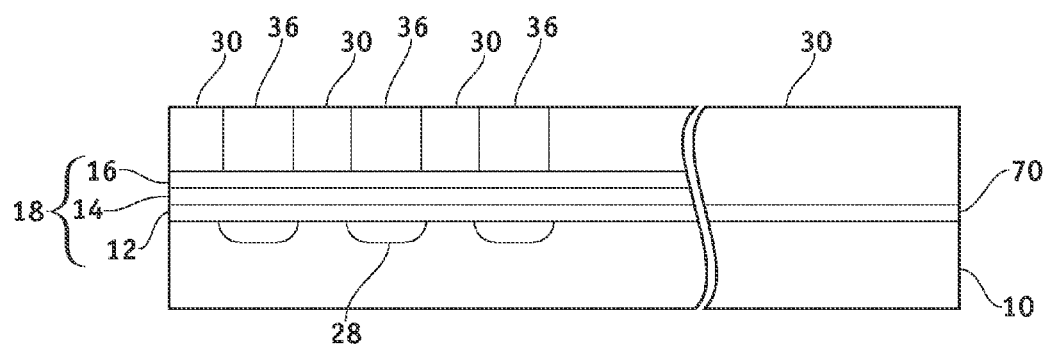

FIGS. 4(a) and 4(b) are diagrams of a dimensional configuration at the step depicted in FIG. 3(c). FIG. 4(a) is an oblique top view. The left side is a core region and the right side is a peripheral circuit region. In addition, the sidewalls 33, the semiconductor substrate 10, and the ONO film 18 are not shown. FIG. 4(b) is a cross-sectional view taken along line A-A. The bit line 28 is formed within the semiconductor substrate 10 in the core region. The ONO film 18 is formed in the core region and a gate oxide film 70 is formed in the peripheral circuit region, on the entire surface of the semiconductor substrate 10. The silicon oxide film 36 is formed on the bit line 28. The first polycrystalline silicon film 30 is formed on the ONO film 18, in the regions other than the bit line 28, or the gate oxide film 70.

In FIGS. 5(a) through 5(d), a second polycrystalline silicon layer 34 (metal layer) is formed on the entire surface. FIG. 5(a) is an oblique top view. The left side is the core region and the right side is the peripheral circuit region. FIG. 5(b) is a cross-sectional view taken along line A-A, in the width direction of the bit line 28. FIG. 5(c) is a cross-sectional view taken along line B-B, in the length direction of the bit line 28 in the bit line 28 region. FIG. 5(d) is a cross-sectional view taken along line C-C, in the length direction of the bit line 28 in the region between the bit lines 28. In the bit line 28 region, the ONO film 18 is formed on the bit line 28, and the silicon oxide film 36 and the second polycrystalline silicon film 34 (metal layer) are laminated onto the ONO film 18. In the region between the bit lines 28, the ONO film 18 is formed on the bit line 28, and the first polycrystalline silicon film 30 and the second polycrystalline silicon film 34 (metal layer) are laminated onto the ONO film 18.

In FIGS. 6(a) through 6(e), as depicted in FIG. 3(d), the gate electrode 31 that includes the word line, including a metal layer intersecting with the bit line 28, and the mask layer is formed by etching the second polycrystalline silicon film 34 (metal layer) and the first polycrystalline silicon layer 30 (mask layer). FIG. 6(a) is an oblique top view. The left side is the core region and the right side is the peripheral circuit region. FIG. 6(b) is a cross-sectional view taken along line A-A, in the length direction of the word line 35 in the word line 35 region. FIG. 6(c) is a cross-sectional view taken along line B-B, in the length direction of the word line 35 in the region between the word lines 35. FIG. 6(*d*) is a cross-sectional view taken along line C-C, in the length direction of the bit line 28 in the bit line 28 region. FIG. 6(*e*) is a cross-sectional view taken along line D-D, in the length direction of the bit line 28 in the region between the bit lines 28.

In the core region, the ONO layer 18 is formed on the bit line 28 under the word line 35 and the silicon oxide film 36 is formed on the ONO layer 18. The ONO layer 18 is formed in region between the bit lines 28 under the word line 35 and the gate electrode 31 is formed on the ONO layer 18. The ONO layer 18 is formed on the bit line 28 in the region between the word lines 35 and only the silicon oxide film 36 is formed on the ONO layer 18. Only the ONO layer 18 is formed in the region between the bit lines 28 in the region between the word lines 35. In the peripheral circuit region, the gate electrode 38 composed of the first polycrystalline silicon film 30 and the second polycrystalline film 34 is formed on the gate oxide film 70 in the gate formation region. In this manner, the gate electrode 31 in the core region, the word line 35 connecting on the gate electrode 31, and the gate electrode 38 in the peripheral circuit region are formed simultaneously by the simultaneous etching of the two layers of polycrystalline silicon film.

Subsequently, in the peripheral circuit region, a transistor for the peripheral circuit is formed. An interlayer insulating film having contact holes is formed. An interconnection layer connecting to the bit line 28 via the contact hole is formed. Lastly, a protective film is formed, and the flash memory in accordance with the first embodiment is completed.

In accordance with the first embodiment, the semiconductor device includes the gate electrode 31 provided on the semiconductor substrate 10, the ONO film 18 that is formed between the gate electrode 31 and the semiconductor substrate 10 and has a charge storage region under the gate electrode, and a bit line 28 that is buried in the semiconductor substrate 10 and includes the low concentration diffusion region 24, the high concentration diffusion region 22 that is formed in the center of the low concentration diffusion region and has a higher impurity concentration than the low concentration diffusion region, the source region, and the drain region. In the bit line 28, the low concentration diffusion region 24 having a low concentration is formed within the high concentration diffusion region 22 from the perspective of the gate electrode 31. This is a lightly-doped drain (LDD) structure. Through use of this structure, a decrease in the source-drain breakdown voltage of the transistor can be prevented even when the high concentration diffusion region 22 is formed by high-energy, high-dosage ion-implantation to reduce the resistance of the bit line 28.

In addition, the dispersal of impurities in the low concentration diffusion region is small due to the heat treatment procedure after formation of the bit line 28 and, thus, the fluctuation in transistor characteristics can be prevented. Furthermore, the semiconductor substrate 10 and the contact hole for connecting with the interconnection layer never connect even when the contact hole moves from the high concentration diffusion region 22 because the low concentration diffusion region 24 is provided. As a result, the flow of the junction current between the semiconductor substrate 10 and the contact hole and the flow of a leak current between the bit line 28 and the semiconductor substrate 10 can be prevented.

In accordance with this first embodiment, the first polycrystalline silicon film 30 in which the mask layer when the bit line 28 is formed is metal allows the low concentration diffusion region 24 to be formed on both sides of the high concentration diffusion region 22 due to the sidewalls provided on the side surfaces of the first polycrystalline silicon (gate electrode) 30. If the bit line is formed using a photoresist 60 as described in Conventional Art 1, sidewalls cannot be formed on the side surfaces thereof because the photoresist cannot be exposed to high temperatures. Therefore, the high concentration diffusion region 22 and the low concentration diffusion region 24 are formed using separate photoresists as the masks and the overlapping dimension of the high concentration diffusion region 22 and the low concentration diffusion region 24 cannot be accurately formed. Thus, the fluctuation in the electrical characteristics of the transistor formed in accordance with Conventional Art 1 increases.

In accordance with the first embodiment, the high concentration diffusion region 22 and the low concentration diffusion region 24 are formed by the formation of the sidewalls 33. The width of the sidewall 33 can be controlled by the thickness of the sidewall film 32 and, therefore, manufacturing can be performed with excellent control of the size, compared to the use of side-etching to control the size as in Conventional Art 2. In this manner, the fluctuation in the electrical characteristics of the transistor due to fluctuation in the sizes of the high concentration diffusion region 22 and the low concentration diffusion region 24 can be prevented.

Furthermore, two charge storage regions 17, 19 are provided in the trap layer 14 of the ONO film 18 under the gate electrode 31 in a manner well known to those skilled in the art. The word line 35 passes perpendicularly above the bit line 28 and is connected to the gate electrode at an upper side thereof. As a result, the bit line 28 can have the LDD structure even in a transistor having two or more charge storage regions in the ONO film 18 under the gate electrode 31.

As in accordance with the first embodiment, the pocket implantation diffusion regions 26 can be formed by pocket implantation when the low concentration diffusion region 24 is formed. In other words, the bit line 28 and the pocket implantation diffusion regions 26 formed on both sides of the low concentration diffusion region 24 in the bit line width direction can be included. As a result, the short channel effect of the transistor can be suppressed. Furthermore, in accordance with the first embodiment, the mask layer forming the bit line 28 is the gate electrode 31 and, accordingly, manufacturing steps can be reduced.

Second Embodiment

A flash memory and a manufacturing method therefor in accordance with a second embodiment are explained with reference to FIGS. 7(*a*) to 10(*b*). These figures are cross-dimensional views of the transistor forming the core in the bit line width direction. The left side is the core region of the memory cell and the right side is the peripheral circuit region.

Referring to FIG. 7(*a*), the tunnel oxide film 12 and the trap layer 14 are formed on the semiconductor substrate 10, as in accordance with the first embodiment. A silicon oxide film is formed on the trap layer 14 as the protective layer 15. The protective layer 15 is a layer that protects the trap layer 14 during the manufacturing process. The protective layer 15 is formed to be 10 nm or more by a thermal oxidization method or a CVD method. The later removal of the protective layer 15 is facilitated by the use of a silicon oxide film as the protective layer 15, thereby securing selectivity with the silicon nitride film that is the trap layer 14 during removal thereof.

In FIG. 7(*b*), a silicon nitride film is formed on the protective layer 15 as a mask layer 40. Here, subsequent etching of the mask layer 40 is facilitated by the use of, for example, the silicon nitride film as the mask layer 40, thereby securing selectivity with the protective layer 15 during etching. Furthermore, in the subsequent silicided metal layer formation, the surface of the semiconductor substrate can be silicided selectively without siliciding the surface.

In FIG. 7(c), an opening region to form the bit line 28 is formed in the mask layer 40. The low concentration diffusion region 24 is formed by implanting arsenic in the semiconductor substrate 10 at, for example, an implantation energy of 30 keV and an implantation dosage of $5 \times 10^{14}$ cm$^{-2}$, using the mask layer 40 as the mask, and subsequently performing heat-treatment thereto. Furthermore, the pocket implantation diffusion regions 26 are formed on both sides of the low concentration diffusion region 24 by performing pocket implantation at an implantation energy of 30 keV and an implantation dosage of $4 \times 10^{13}$ cm$^{-2}$ and, subsequently, performing heat-treatment thereto.

Figure 8A:
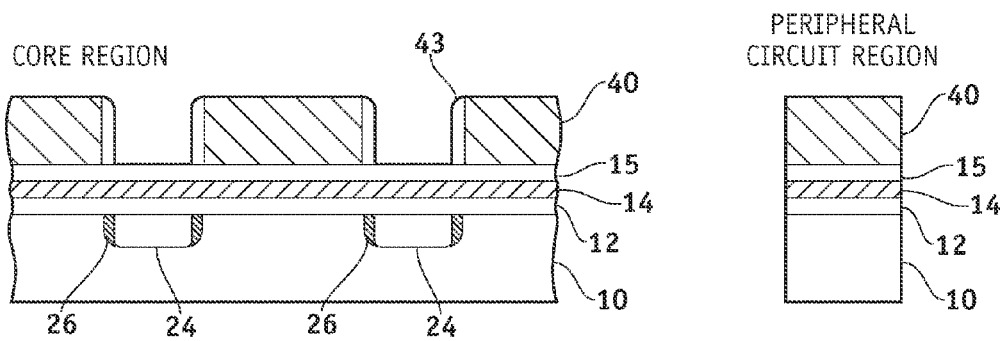
FIGS. 8(a) to 8(d) are respective second cross-sectional views of the flash memory and the manufacturing method therefor in accordance with the second embodiment of the present invention.

In FIG. 7(d), a sidewall film 42 having a film thickness of 50 nm is formed with, for example, a silicon nitride film on the mask layer 40. The mask layer 40 and sidewalls 43 can subsequently be removed simultaneously by the use of the same silicon nitride film as the mask layer 40 for the sidewall film 42. In FIG. 8(a), the entire surface of the sidewall film 42 is anisotropically dry-etched and the sidewalls 43 are formed on the side surfaces of the mask layer 40 in the bit line 28 width direction. The film thickness of the sidewall film 42 can control the width of the sidewalls 43.

Figure 8B:
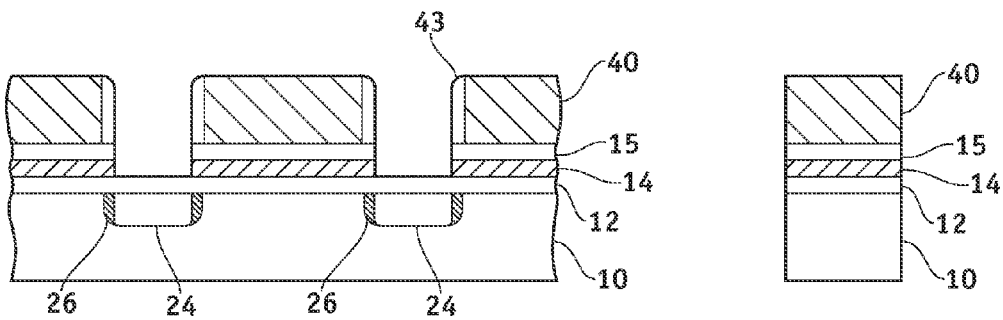
Figure 8C:
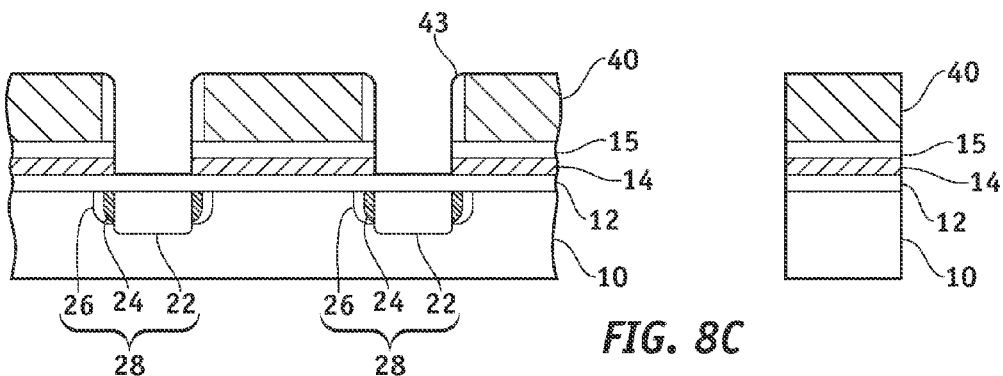

In FIG. 8(b), the protective layer 15 and the trap layer 14 are etched using the mask layer 40 and the sidewalls 43 as the mask. In FIG. 8(c), the high concentration diffusion region 22 is formed by implanting arsenic in the semiconductor substrate 10 at, for example, an implantation energy of 40 keV and an implantation dosage of $2 \times 10^{15}$ cm$^{-2}$ using the mask layer 40 and the sidewalls 43 as the mask and, subsequently, performing heat treatment thereto. The ion implantation energy can be reduced compared to using the ONO film 18 as a through-film as in accordance with the first embodiment by the use of only the tunnel oxide film 12 as the ion implantation through-film. Thus, dispersion of the ion-implanted impurities in the horizontal direction can be reduced. As a result, a further miniaturized bit line 28 can be formed.

Figure 8D:
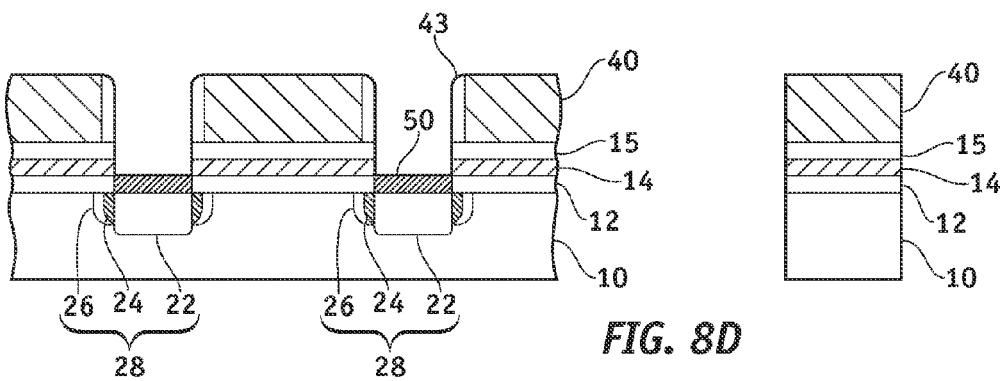

In FIG. 8(d), the tunnel oxide film 12 is etched using the mask layer 40 and the sidewalls 43 as the mask. A silicided metal layer 50 is formed on the surface of the bit line 28 using the mask layer 40 and the sidewalls 43 as the mask. The formation of the silicided metal layer 50 is made by, for example, forming cobalt or titanium on the entire surface using a sputter technique and thereafter performing heat treatment thereto. The resistance of the bit line 28 can be reduced by the formation of the silicided metal layer 50 created consecutively in the length direction of the bit line 28.

Figure 9A:
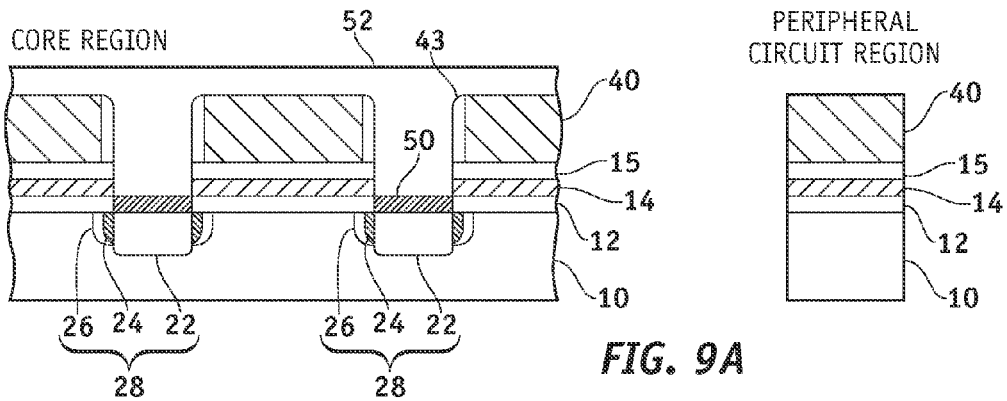
FIGS. 9(a) to 9(d) are respective third cross-sectional views of the flash memory and the manufacturing method therefor in accordance with the second embodiment of the present invention.
Figure 9B:
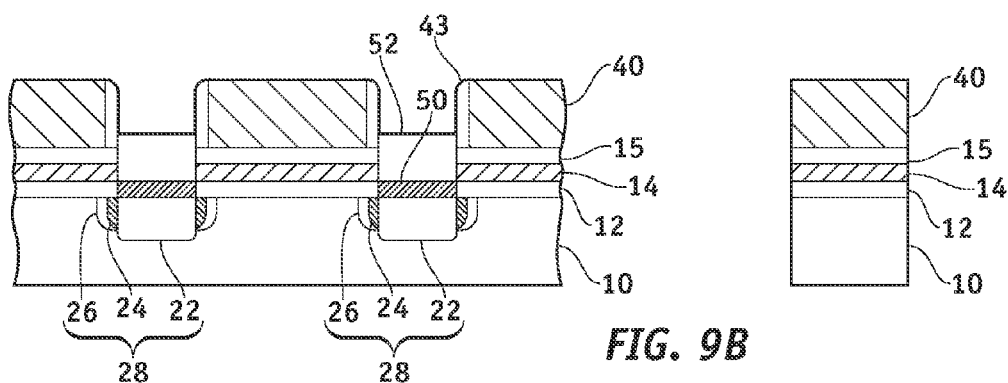
Figure 9C:
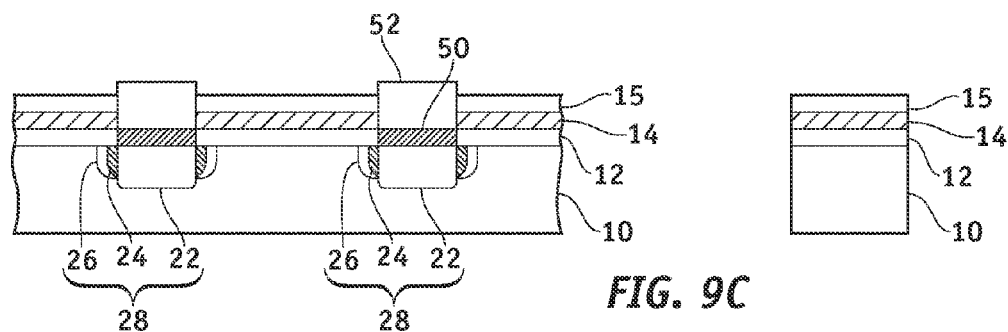

In FIG. 9(a), a resin layer 52 is formed to cover the mask layer 40 by the application of resin. HSQ (hydrogen-silsesquioxane), for example, can be used as the resin. In FIG. 9(b), a portion of the resin layer 52 is removed by, for example, an ashing technique, and the resin layer 52 is left remaining on the silicided metal layer between the sidewalls 43. In other words, the resin layer 52 is selectively formed on the silicided metal layer. The resin layer 52 preferably covers the side surfaces of the trap layer 14. The mask layer 40 and the sidewalls 43 are removed by, for example, hot phosphoric acid. At this time, the side surfaces of the trap layer 14, which is a silicon nitride film, is protected by the resin layer 52. Thus, the mask layer 40 and the sidewalls 43 can be removed easily without removing the trap layer 14.

Figure 9D:
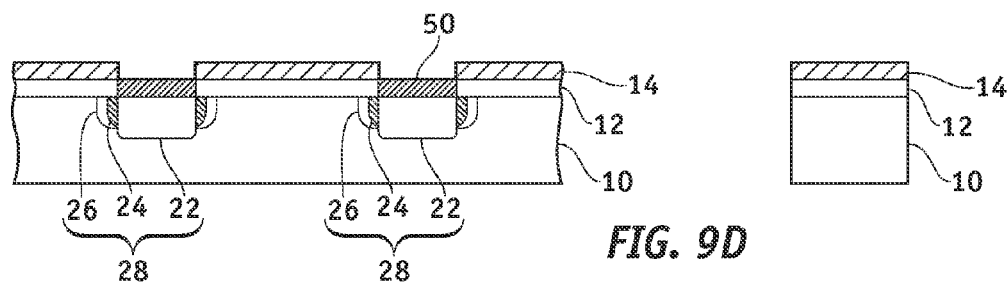
Figure 10A:
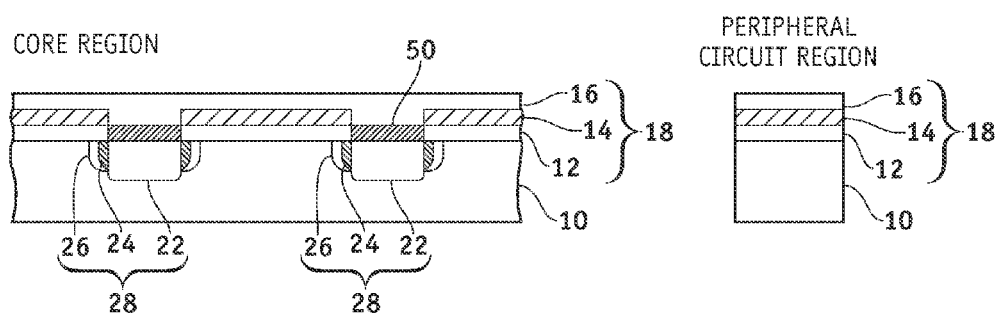
FIGS. 10(a) and 10(b) are respective fourth cross-sectional views of the flash memory and the manufacturing method therefor in accordance with the second embodiment of the present invention.

In FIG. 9(d), the resin layer 52 is removed and the protective layer 15 is removed. In FIG. 10(a), a silicon oxide film is formed on the surface of the trap layer 14 and the silicided metal layer 50 as the top oxide film 16 using, for example, a CVD method. At this time, the temperature of formation is preferably a temperature that prevents oxidization of the silicided metal layer 50, for example, below 800° C. In this way, the ONO film 18 having a tunnel oxide film 12, a trap layer 14, and a top oxide film 16 is formed. A satisfactory insulation characteristic between the silicided metal layer 50 and a word line 58 can be acquired because the top oxide film 16 is good membranous material that has not been exposed to ion implantation.

Figure 10B:
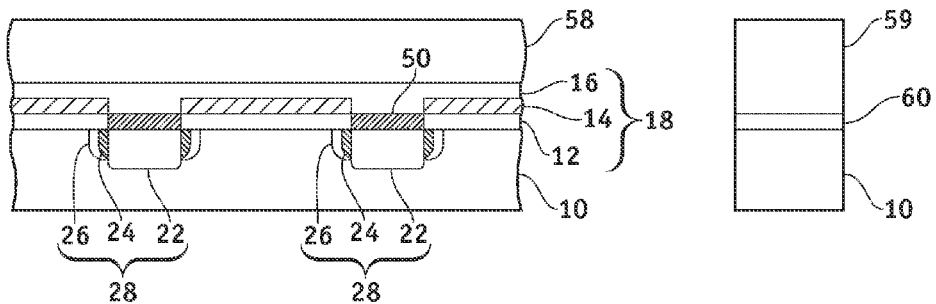

Finally, in FIG. 10(b), the ONO film 18 in the peripheral circuit region is removed and a gate oxide film 60 is formed. The word line 58 that serves as the gate electrode is formed in the core region by deposition of a polycrystalline silicon film and etching of a predetermined region. Then, the transistor for the peripheral circuit is formed in the peripheral circuit region. Furthermore, the interlayer insulating film having contact holes is formed. The interconnection layer connecting with the bit line 28 is formed via the contact hole. Lastly, the protective layer is formed, and the flash memory in accordance with the second embodiment is completed.

In accordance with the second embodiment, the bit line 28 has an LDD structure as in the first embodiment. As a result, the reduction in the source-drain breakdown voltage of the transistor can be prevented. In addition, the flow of the leak current between the bit line 28 and the semiconductor substrate 10 can be prevented, even when the contact hole moves from the high concentration diffusion region. Furthermore, the mask layer 40 is a silicon nitride film that is an insulating film and the sidewalls 43 can be formed on the side surfaces of the mask layer 40. Thus, fluctuation in the electrical characteristics of the transistor can be reduced.

In addition, the short channel effect of the transistor can be suppressed by the pocket implantation. Furthermore, the silicon nitride film is used as the mask layer 40 in accordance with the second embodiment and, thus, the silicided metal layer 50 can be formed selectively on the bit line 28. As a result, the resistance of the bit line can be reduced and the memory cells can be miniaturized.

Although embodiments of the present invention have been explained above, the present invention is not limited to the specific embodiments, and various changes and modifications can be made without departing from the principles and spirit of the invention, the scope of which is defined in the claims hereinbelow.

What is claimed is:

1. A semiconductor device comprising:
   a gate electrode located above a channel region in a semiconductor substrate; an ONO film formed between the semiconductor substrate and the gate electrode;
   multiple charge storage regions provided in the ONO film under the gate electrode and above the channel region; and
   a bit line formed in the semiconductor substrate and adjoining the channel region, the bit line comprising a bit line region serving as both a source region and a drain region for storing and reading information stored in the multiple charge storage regions, the bit line region including a low concentration diffusion region and a high concentration diffusion region, wherein the high concentration region is provided at a center of the low concentration diffusion region and has a higher impurity concentration than the low concentration diffusion region and wherein the low concentration diffusion region is the only diffusion region that contacts side portions of the high concentration diffusion region.

2. The semiconductor device as claimed in claim 1, wherein the bit line includes pocket implantation diffusion regions formed at both sides of the low concentration diffusion region.

3. The semiconductor device as claimed in claim 1, further comprising a word line provided above the bit line and connected to the gate electrode at an upper side thereof.

4. The semiconductor device as claimed in claim 3, further comprising sidewalls provided at sides of the gate electrode.

5. The semiconductor device as claimed in claim 1, further comprising a silicided metal layer provided on the semiconductor substrate over the bit line and running continuously in a direction of a length of the bit line.

* * * * *